(12) United States Patent
Wang et al.

(10) Patent No.: US 8,686,568 B2
(45) Date of Patent: Apr. 1, 2014

(54) SEMICONDUCTOR PACKAGE SUBSTRATES HAVING LAYERED CIRCUIT SEGMENTS, AND RELATED METHODS

(71) Applicant: Advanced Semiconductor Engineering, Inc., Kaohsiung (TW)

(72) Inventors: Sheng-Ming Wang, Taoyuan (TW); Hsiang-Ming Feng, Zhongli (TW); Yen-Hua Kuo, Luzhu Township (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 13/629,397

(22) Filed: Sep. 27, 2012

(65) Prior Publication Data

US 2014/0084480 A1   Mar. 27, 2014

(51) Int. Cl.
| | |
|---|---|
| *H01L 23/48* | (2006.01) |
| *H01L 23/52* | (2006.01) |
| *H01L 29/40* | (2006.01) |
| *H01L 21/4763* | (2006.01) |
| *H01L 21/44* | (2006.01) |

(52) U.S. Cl.
USPC .................. 257/774; 257/621; 257/E21.597; 438/637; 438/667; 438/672; 438/675

(58) Field of Classification Search
USPC ......... 257/621, 774, 730, 731, 782, 786, 737, 257/738, 784, E21.597; 438/629, 637, 639, 438/640, 667, 668, 672, 675, 700, 701, 713, 438/978, 118, 617, 612, 666, 613
See application file for complete search history.

(56) References Cited

U.S. PATENT DOCUMENTS

| | | |
|---|---|---|
| 3,761,309 A | 9/1973 | Schmitter et al. |
| 4,341,594 A | 7/1982 | Carlson et al. |
| 4,845,542 A | 7/1989 | Bezuk et al. |
| 5,466,635 A | 11/1995 | Lynch et al. |
| 5,629,564 A | 5/1997 | Nye, III et al. |
| 5,640,052 A | 6/1997 | Tsukamoto |
| 5,656,858 A | 8/1997 | Kondo et al. |
| 5,698,465 A | 12/1997 | Lynch et al. |
| 5,790,377 A | 8/1998 | Schreiber et al. |
| 5,872,404 A | 2/1999 | Lynch et al. |
| 5,914,536 A | 6/1999 | Shizuki et al. |
| 5,943,597 A | 8/1999 | Kleffner et al. |
| 6,013,571 A | 1/2000 | Morrell |
| 6,028,357 A | 2/2000 | Moriyama |

(Continued)

FOREIGN PATENT DOCUMENTS

| | | |
|---|---|---|
| CN | 1391278 | 1/2003 |
| CN | 1835218 | 9/2006 |

(Continued)

*Primary Examiner* — Matthew Reames
*Assistant Examiner* — Dilinh Nguyen
(74) *Attorney, Agent, or Firm* — Klein, O'Neill & Singh, LLP

(57) ABSTRACT

The package substrate includes a core, a plurality of first circuit segments, and a plurality of conductive pillars. Each of the first circuit segments has a patterned metal layer disposed on the core, a barrier layer disposed on the patterned metal layer, and an upper metal pattern disposed on the barrier layer. The conductive pillars penetrate the core, the patterned metal layer, and the barrier layer, and contact the upper metal pattern. The conductive pillars are formed from a material that can be selectively removed without affecting the barrier layer.

19 Claims, 7 Drawing Sheets

(56) References Cited

U.S. PATENT DOCUMENTS

| | | |
|---|---|---|
| 6,051,450 A | 4/2000 | Oshawa et al. |
| 6,077,765 A | 6/2000 | Naya |
| 6,107,164 A | 8/2000 | Ohuchi |
| 6,159,837 A | 12/2000 | Yamaji et al. |
| 6,177,636 B1 | 1/2001 | Fjelstad |
| 6,194,990 B1 | 2/2001 | Lee et al. |
| 6,229,220 B1 | 5/2001 | Saitoh et al. |
| 6,281,106 B1 | 8/2001 | Higdon et al. |
| 6,350,705 B1 | 2/2002 | Lin |
| 6,362,087 B1 | 3/2002 | Wang et al. |
| 6,362,090 B1 | 3/2002 | Paik et al. |
| 6,378,759 B1 | 4/2002 | Ho et al. |
| 6,501,185 B1 | 12/2002 | Chow et al. |
| 6,510,976 B2 | 1/2003 | Hwee et al. |
| 6,550,666 B2 | 4/2003 | Chew et al. |
| 6,573,598 B2 | 6/2003 | Ohuchi et al. |
| 6,578,754 B1 | 6/2003 | Tung |
| 6,592,019 B2 | 7/2003 | Tung |
| 6,599,775 B2 | 7/2003 | Tie et al. |
| 6,600,234 B2 | 7/2003 | Kuwabara et al. |
| 6,639,299 B2 | 10/2003 | Aoki |
| 6,642,136 B1 | 11/2003 | Lee et al. |
| 6,664,128 B2 | 12/2003 | Tong et al. |
| 6,681,982 B2 | 1/2004 | Tung |
| 6,683,375 B2 | 1/2004 | Joshi et al. |
| 6,731,003 B2 | 5/2004 | Joshi et al. |
| 6,732,913 B2 | 5/2004 | Alvarez |
| 6,734,039 B2 | 5/2004 | Hwee et al. |
| 6,740,577 B2 | 5/2004 | Jin et al. |
| 6,750,082 B2 | 6/2004 | Briar et al. |
| 6,756,671 B2 | 6/2004 | Lee et al. |
| 6,784,087 B2 | 8/2004 | Lee et al. |
| 6,818,545 B2 | 11/2004 | Lee et al. |
| 6,888,209 B2 | 5/2005 | Jobetto |
| 6,917,119 B2 | 7/2005 | Lee et al. |
| 6,929,981 B2 | 8/2005 | Hwee et al. |
| 6,940,168 B2 | 9/2005 | Garrity et al. |
| 7,008,867 B2 | 3/2006 | Lei |
| 7,022,548 B2 | 4/2006 | Joshi et al. |
| 7,087,458 B2 | 8/2006 | Wang et al. |
| 7,122,403 B2 | 10/2006 | Chandran et al. |
| 7,135,770 B2 | 11/2006 | Nishiyama et al. |
| 7,268,438 B2 | 9/2007 | Nishiyama et al. |
| 7,276,801 B2 | 10/2007 | Dubin et al. |
| 7,361,990 B2 | 4/2008 | Lu et al. |
| 7,391,112 B2 | 6/2008 | Li et al. |
| 7,449,406 B2 | 11/2008 | Nishiyama et al. |
| 7,456,496 B2 | 11/2008 | Hwee et al. |
| 7,462,942 B2 | 12/2008 | Tan et al. |
| 7,476,564 B2 | 1/2009 | Chen et al. |
| 7,550,375 B2 | 6/2009 | Wang et al. |
| 7,932,170 B1 | 4/2011 | Huemoeller et al. |
| 2002/0011664 A1 | 1/2002 | Tanaka |
| 2003/0127734 A1 | 7/2003 | Lee et al. |
| 2003/0129822 A1 | 7/2003 | Lee et al. |
| 2003/0219966 A1 | 11/2003 | Jin et al. |
| 2004/0087057 A1 | 5/2004 | Wang et al. |
| 2006/0006544 A1 | 1/2006 | Farrar |
| 2006/0197648 A1 | 9/2006 | Smith et al. |
| 2007/0004086 A1 | 1/2007 | Hua et al. |
| 2007/0075423 A1 | 4/2007 | Ke et al. |
| 2008/0150161 A1 | 6/2008 | Lin et al. |
| 2008/0296761 A1 | 12/2008 | Lee et al. |
| 2009/0072385 A1 | 3/2009 | Alley et al. |
| 2009/0096092 A1 | 4/2009 | Patel |
| 2009/0155955 A1 | 6/2009 | Liang |
| 2009/0250821 A1* | 10/2009 | Borthakur .................. 257/762 |
| 2009/0289360 A1 | 11/2009 | Takahashi et al. |
| 2010/0244024 A1 | 9/2010 | Do et al. |
| 2011/0084381 A1 | 4/2011 | Lo et al. |
| 2011/0084389 A1 | 4/2011 | Lo et al. |
| 2011/0114374 A1* | 5/2011 | Iwata et al. .................. 174/257 |
| 2011/0304026 A1* | 12/2011 | Tsui et al. .................... 257/621 |
| 2012/0074532 A1 | 3/2012 | Shih et al. |

FOREIGN PATENT DOCUMENTS

| | | |
|---|---|---|
| CN | 1866504 | 11/2006 |
| JP | 54128669 | 10/1979 |
| JP | 60217646 | 10/1985 |
| JP | 62160744 | 7/1987 |
| JP | 1123440 | 5/1989 |
| JP | 4144143 | 5/1992 |
| JP | 5109820 | 4/1993 |
| JP | 5152376 | 6/1993 |
| JP | 5315339 | 11/1993 |
| JP | 7211722 | 8/1995 |
| JP | 7335648 | 12/1995 |
| JP | 8008259 | 1/1996 |
| JP | 8013166 | 1/1996 |
| JP | 9045691 | 2/1997 |
| JP | 9266230 | 10/1997 |
| JP | 2000091371 | 3/2000 |
| JP | 2000269387 | 9/2000 |
| JP | 2002043352 | 2/2002 |
| JP | 2006279062 | 10/2006 |
| JP | 2008047667 | 2/2008 |

\* cited by examiner

SEMICONDUCTOR PACKAGE SUBSTRATES HAVING LAYERED CIRCUIT SEGMENTS, AND RELATED METHODS

TECHNICAL FIELD

The present embodiments relate to a semiconductor package substrate, a semiconductor package assembled using the substrate, and methods for making the substrate and the package.

BACKGROUND

Some conventional package substrates include at least one conductive through via for interconnecting top and bottom circuits. In the manufacturing process, the conductive through vias are formed by plating a conductive metal in through holes formed in the package substrate.

However, in the production of high aspect ratio package substrates, fully filling the substrate's high-aspect-ratio through holes by Cu-plating often leads to over-plating, which, in turn, results in over-plated Cu on a resist pattern or poor line definition in a subsequent circuit-forming step of selectively etching.

SUMMARY

One of the present embodiments comprises a semiconductor package. The package comprises a substrate. The substrate comprises a core having a plurality of through holes and defining a first surface. The substrate further comprises a plurality of circuit segments disposed on the core. Each of the circuit segments includes a first patterned metal layer on the first surface, an intermediate metal layer on the patterned metal layer, a barrier layer on the intermediate metal layer, and a second patterned metal layer on the barrier layer. The substrate further comprises a plurality of conductive pillars disposed in the through holes of the core and connected to the circuit segments. An end of each conductive pillar protrudes from the first surface of the core such that an end surface of each conductive pillar is coplanar with a surface of a corresponding portion of the barrier layer. The upper metal pattern covers the end surfaces of the conductive pillars and the coplanar surface of the barrier layer.

Another of the present embodiments comprises a semiconductor package. The package comprises a substrate. The substrate comprises a core having a plurality of through holes and defining a first surface. The substrate further comprises a plurality of circuit segments disposed on the core. Each of the circuit segments includes a first patterned metal layer on the first surface, an intermediate metal layer on the patterned metal layer, a barrier layer on the intermediate metal layer, and a second patterned metal layer on the barrier layer. Lateral surfaces of the first patterned metal layer, the intermediate metal layer, the barrier layer, and the second patterned metal layer are coplanar. The substrate further comprises a plurality of conductive vias disposed in the through holes of the core and connected to the circuit segments.

Another of the present embodiments comprises a method for making a semiconductor package substrate. The method comprises disposing a first metal layer on a core. The method further comprises forming a plurality of through holes penetrating the core and the first metal layer. The method further comprises forming an intermediate metal layer in the through holes and on the first metal layer. The method further comprises forming a barrier layer on the intermediate metal layer. The method further comprises applying a conductive material on the barrier layer to form a surface plating portion and in the through holes to form a plurality of conductive pillars. The method further comprises removing the surface plating portion until the barrier layer is exposed. The method further comprises forming an upper metal pattern on the exposed barrier layer and the conductive pillars. The method further comprises removing portions of the barrier layer, the intermediate metal layer and the first metal layer that are not covered by the upper metal pattern so as to form a plurality of circuit segments.

BRIEF DESCRIPTION OF THE DRAWINGS

Common reference numerals are used throughout the drawings and the detailed description to indicate the same elements. The present invention will be more apparent from the following detailed description taken in conjunction with the accompanying drawings.

DETAILED DESCRIPTION

Figure 1:
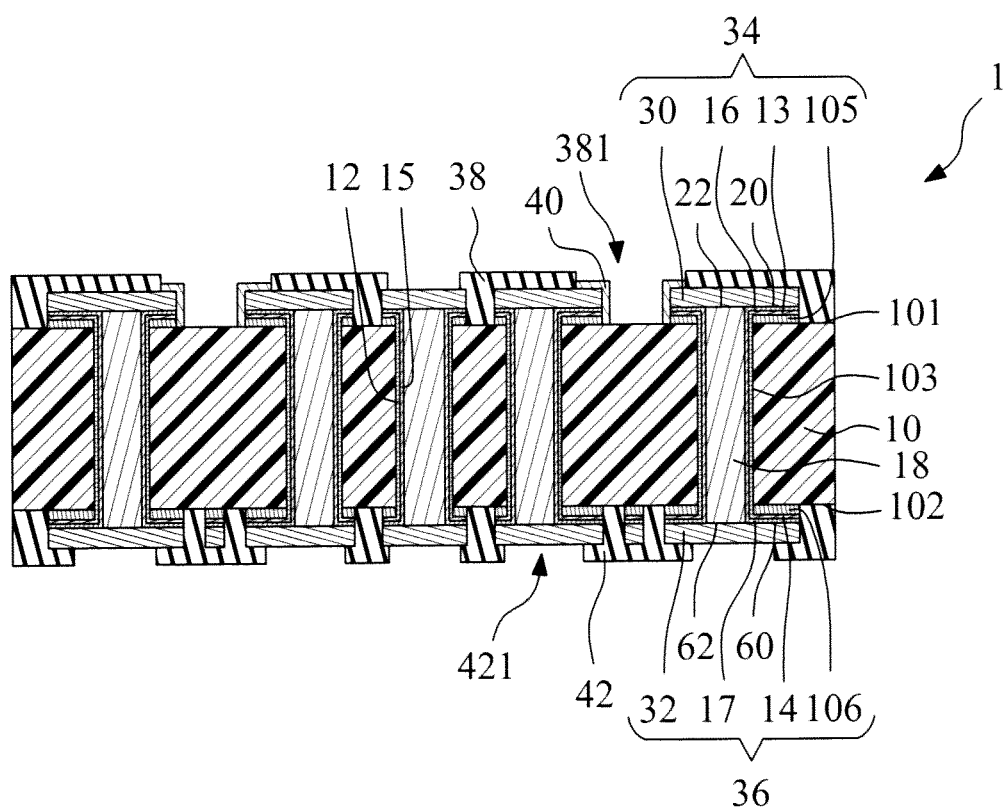
FIG. 1 illustrates a cross-sectional view of a package substrate according to one of the present embodiments.

Referring to FIG. 1, a package substrate 1 according to one of the present embodiments is shown. The substrate 1 includes a core 10, a plurality of conductive pillars 18, a plurality of first circuit segments 34 disposed on a first or upper surface 101 of the core 10, a plurality of second circuit segments 36 disposed on a second or lower surface 102 of the core 10, a first protection layer 38, a second protection layer 42, and a surface finish layer 40.

In certain embodiments, the core 10 may be made of a fiber-reinforced resin material and/or prepreg (PP) for increased rigidity. The fibers may be glass fibers or Kevlar fibers (aramid fibers), for example. Examples of resin materials that may be reinforced by fibers for use in the laminated dielectric material include Ajinomoto build-up film (ABF), bismaleimide triazine (BT), prepreg, polyimide (PI), liquid crystal polymer (LCP), epoxy, and other resin materials e.g. copper clad laminate (CCL) made of BT or FR-4/FR-5 epoxies, for example.

The core 10 includes a plurality of through holes 103 within which the conductive pillars 18 are disposed. As shown in FIG. 1, the conductive pillars 18 protrude from the upper and lower surfaces 101, 102. The first circuit segments 34 are disposed on the first surface 101 of the core 10, wherein each of the various segments 34 are associated with a respective one of the pillars 18. Each of the first circuit segments 34 has a first patterned metal layer 105, a first intermediate metal layer 13, a first barrier layer 16, and an upper metal pattern 30. The first patterned metal layer 105 is disposed on the first surface 101 of the core 10 and a portion thereof is annular such it forms a central opening through which the pillar 18 protrudes. The first intermediate metal layer 13 is disposed on the first patterned metal layer 105, and a portion thereof is annular and circumscribes the pillar 18. The first barrier layer 16 is disposed on the first intermediate metal layer 13, and a portion thereof is annular and circumscribes the pillar 18. An upper surface 20 of the first barrier layer 16 is substantially coplanar with an upper surface 22 of an end of the pillar 18. The upper metal pattern 30 is disposed on the first barrier layer 16, overlies and is in electrical contact with the upper surface 22 of the pillar 18. Thus, the upper metal pattern 30 has a portion forming a cap over each of the vias 18. That is, the conductive pillar 18 has a surface 22 exposed from the first barrier layer 16, and the upper metal pattern 30 covers the exposed surface 22 of the conductive pillar 18. In addition, the conductive pillar 18 has a portion protruding from the upper surface 101 of the core 10, and the protruding portion is covered by the upper metal pattern 30.

In certain embodiments, the material of the first barrier layer 16 may be different from that of the first patterned metal layer 105. In such embodiments, the first barrier layer 16 may comprise, for example, nickel (Ni), and the first intermediate metal layer 13, the first patterned metal layer 105, and the upper metal pattern 30 may comprise, for example, copper (Cu). The first circuit segments 34 may have traces or pads, and are electrically insulated from each other. In this embodiment, the width of the first patterned metal layer 105, the width of the first intermediate metal layer 13, the width of the first barrier layer 16, and the width of the upper metal pattern 30 are equal.

The second circuit segments 36 are disposed on the second surface 102 of the core 10, wherein each of the various segments 36 are associated with a respective one of the pillars 18. Each of the second circuit segments 36 has a second patterned metal layer 106, a second intermediate metal layer 14, a second barrier layer 17, and a lower metal pattern 32. The second patterned metal layer 106 is disposed on the second surface 102 of the core 10 and a portion thereof is annular such it forms a central opening through which the pillar 18 protrudes. The second intermediate metal layer 14 is disposed on the annular portion of the second patterned metal layer 106 such that it is annular and circumscribes the pillar 18. The second barrier layer 17 is disposed on the annular portion of the second intermediate metal layer 14 such that it is annular and circumscribes the pillar 18. A bottom surface 60 of the second barrier layer 17 is substantially coplanar with a bottom surface 62 of the pillar 18. The lower metal pattern 32 is disposed on the second barrier layer 17 and overlies and is in electrical contact with the bottom surface 62 of the pillar 18. Thus, the lower metal pattern 32 forms a cap over each of the respective vias 18. That is, the conductive pillar 18 has a surface 62 exposed from the second barrier layer 17, and the lower metal pattern 32 covers the exposed surface 62 of the conductive pillar 18. Alternatively, the conductive pillar 18 has a portion protruding from the second surface 102 of the core 10, and the protruding portion is covered by the lower metal pattern 32.

The first intermediate metal layer 13 and the second intermediate metal layer 14 may be contiguous with the intermediate metal layer 12. The intermediate metal layer 12 may be, for example, a Cu seed layer. The intermediate metal layer 12 is also disposed on the sidewalls of the through holes 103. Further, the first barrier layer 16 and the second barrier layer 17 may be contiguous with the barrier layer 15. The barrier layer 15 is disposed on the intermediate metal layer 12.

In certain embodiments, the material of the second barrier layer 17 may be different from that of the second patterned metal layer 106. In this embodiment, the material of the second barrier layer 17 may be Ni, and the material of the second intermediate metal layer 14, the second patterned metal layer 106, and the lower metal pattern 32 may be Cu. The second circuit segments 36 may have traces or pads, and are electrically insulated from each other. In this embodiment, the width of the second patterned metal layer 106, the width of the second intermediate metal layer 14, the width of the second barrier layer 17, and the width of the lower metal pattern 32 are equal.

The conductive pillars 18 are disposed in the through holes 103 of the core 10, and penetrate the core 10, the first metal layer 105, the first intermediate metal layer 13, the first barrier layer 16, the second metal layer 106, the second intermediate metal layer 14, and the second barrier layer 17. Opposite ends 60, 62 of the conductive pillars 18 contact the upper metal pattern 30 and the lower metal pattern 32, respectively. In some embodiments, the conductive pillars 18 are formed from a material that can be selectively removed without affecting the first barrier layer 16 or the second barrier layer 17. The barrier layers 16, 17 can thus act as a shield for the underlying intermediate metal layers 13, 14 during a process of manufacturing the pillars 18, as described below. In these embodiments, the material of the conductive pillars 18 may be a conductive metal such as Cu.

The first protection layer 38 is disposed on the first circuit segments 34, and has a plurality of openings 381 that expose portions of the first circuit segments 34. The second protection layer 42 is disposed on the second circuit segments 36, and has a plurality of openings 421 that expose portions of the second circuit segments 36. In this embodiment, the first protection layer 38 and the second protection layer 42 may be solder mask, such as polyimide. The surface finish layer 40 is disposed on the exposed portions of the first circuit segments 34. The surface finish layer 40 may comprise, for example, a nickel/gold (Ni/Au) alloy.

Figure 2:
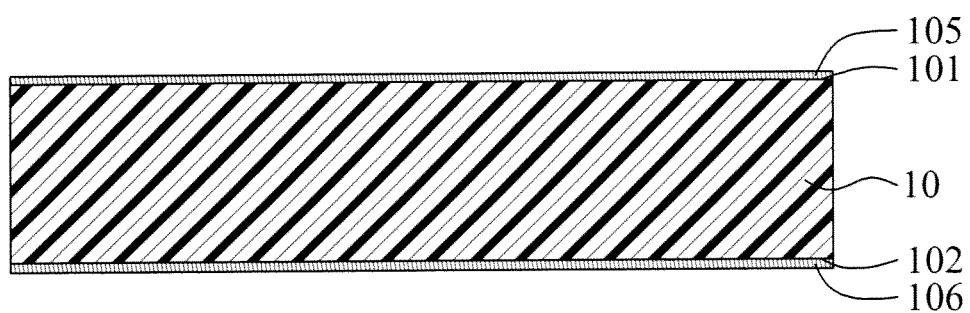
FIGS. 2-12 illustrate steps in a process for making a package substrate according to one of the present embodiments.

Referring to FIGS. 2-11, a process for making a package substrate according to one of the present embodiments is illustrated. FIG. 2 illustrates the core 10, the first metal layer 105 before patterning, and the second metal layer 106 before patterning. The first metal layer 105 is disposed on the first surface 101 of the core 10, and the second metal layer 106 is disposed on the second surface 102 of the core 10.

Figure 3:
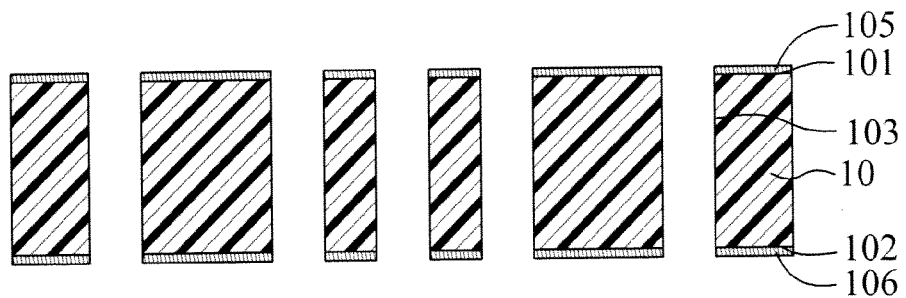

Referring to FIG. 3, a plurality of through holes 103 are formed to penetrate the core 10, the first metal layer 105, and the second metal layer 106. The through holes 103 may be formed by laser drilling or mechanical drilling, for example, or any other process. In forming the through holes 103, the metal layers 105, 106 are patterned in that openings of substantially the same diameter as the through holes 103 are formed in the metal layers 105, 106 in areas corresponding to the through holes 103.

Figure 4:
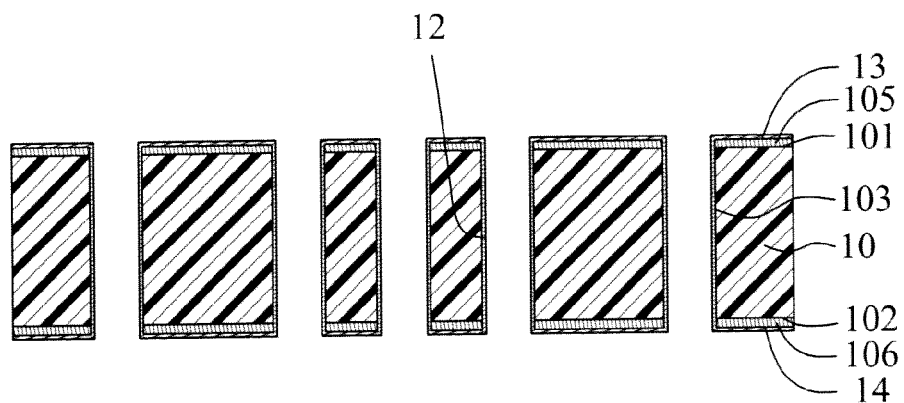

Referring to FIG. 4, the intermediate metal layer 12 before patterning is formed on the sidewalls of the through holes 103 and on the first metal layer 105 and the second metal layer 106. The portion of the intermediate metal layer 12 that is on the first metal layer 105 is defined as the first intermediate metal layer 13, and the portion of the intermediate metal layer 12 that is on the second metal layer 106 is defined as the second intermediate metal layer 14. The intermediate metal layer 12 may be formed by a sputtering process, an immersion process, a plating process, or any other suitable process. The material of the intermediate metal layer 12 may be, for example, Cu or any other electrically conductive material.

Figure 5:
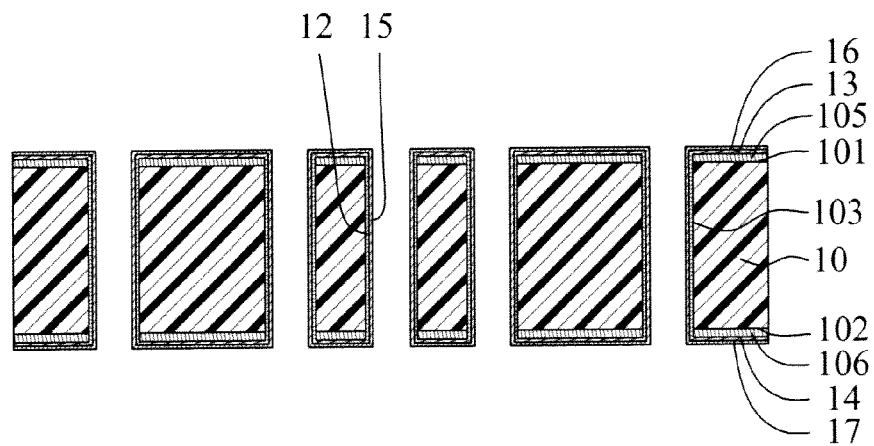

Referring to FIG. 5, a barrier layer 15 before patterning is formed on the intermediate metal layer 12. The portion of the barrier layer 15 that is on the first intermediate metal layer 13 is defined as the first barrier layer 16, and the portion of the barrier layer 15 that is on the second intermediate metal layer 14 is defined as the second barrier layer 17. The barrier layer 15 may be formed by a sputtering process, an immersion process, a plating process, or any other suitable process. The material of the barrier layer 15 may be, for example, Ni or any other electrically conductive material.

Figure 6:
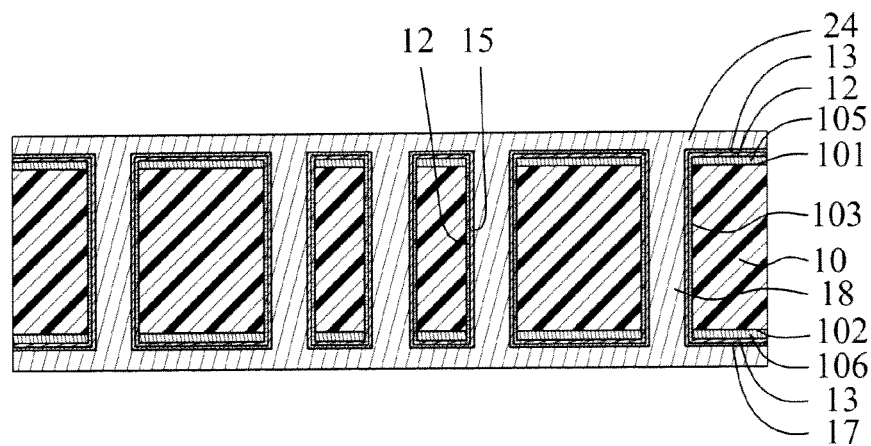

Referring to FIG. 6, a conductive material 24 is formed on the barrier layer 15. The conductive material 24 may be formed by a plating process, for example, or any other process. The conductive material 24 completely fills the through holes 103 to form the conductive pillars 18, and extends over the first barrier layer 16 and the second barrier layer 17 to form a surface plating portion. The conductive material 24, e.g. copper, is such that it can be selectively removed without detrimental effect to the first barrier layer 16. When the through holes 103 have a high aspect ratio, e.g., 1.7:1 to 8:1 (aspect ratio is the ratio of the thickness of the core 10 to the diameter of the through hole 103), over-plating may be used to ensure that the conductive material 24 completely fills the through holes 103. In some embodiments, this step of forming the conductive material 24 may include forming a seed layer by electroless plating and electro-plating a Cu layer over the seed layer.

Figure 7:
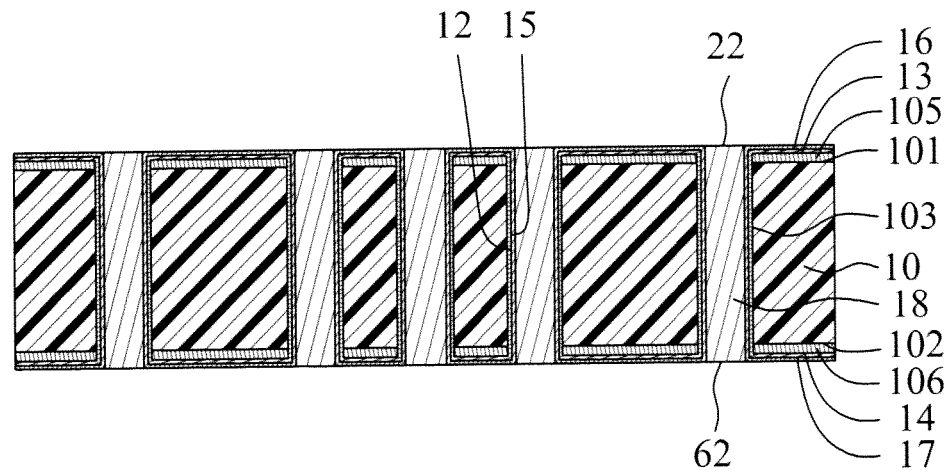

Referring to FIG. 7, the surface plating portion of the conductive material 24 is removed until the barrier layer 15 is exposed. In this embodiment, portions of the conductive material 24 (the surface plating portion) are removed by etching or other means such that the first barrier layer 16 and the second barrier layer 17 are exposed and substantially coplanar with the respective ends 22, 62 of the conductive pillars 18. In some embodiments, the ends 22, 62 of the pillars 18 may be over-etched, thereby forming a concave or a cup-like surface (not shown) on each end 22, 62. In such embodiments, the ends 22, 62 are still considered as being substantially coplanar with the barrier layers 16, 17, respectively.

The first barrier layer 16 and the second barrier layer 17 act as a shield to prevent over-etching of the surface plating portion of the conductive material 24, which, in turn, can prevent the first intermediate metal layer 13 and the second intermediate metal layer 14 from being etched. Therefore, even if the surface plating portion of the conductive material 24 becomes over-thick due to the over-plating mentioned above, it can still be etched away completely without damaging the first intermediate metal layer 13 and the second intermediate metal layer 14.

Figure 8:
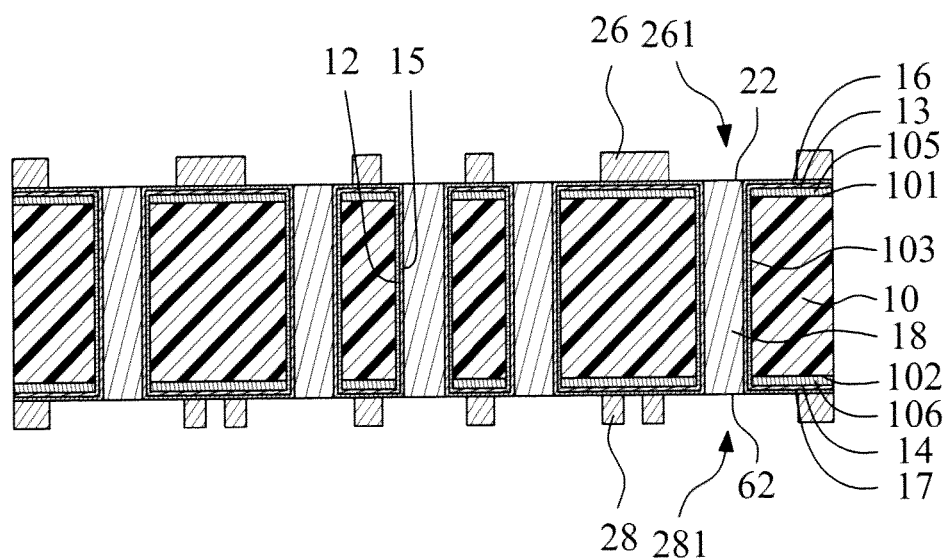

Referring to FIG. 8, a first photoresist pattern 26 and a second photoresist pattern 28 are formed on the first barrier layer 16 and the second barrier layer 17, respectively. In this embodiment, the first photoresist pattern 26 and the second photoresist pattern 28 may be formed from dry films, and predetermined or selected portions of the dry films may be photoimaged and developed so as to create a plurality of openings 261, 281, respectively. Ends 22, 62 of the conductive pillars 18 are exposed in the corresponding openings 261, 281.

Figure 9:
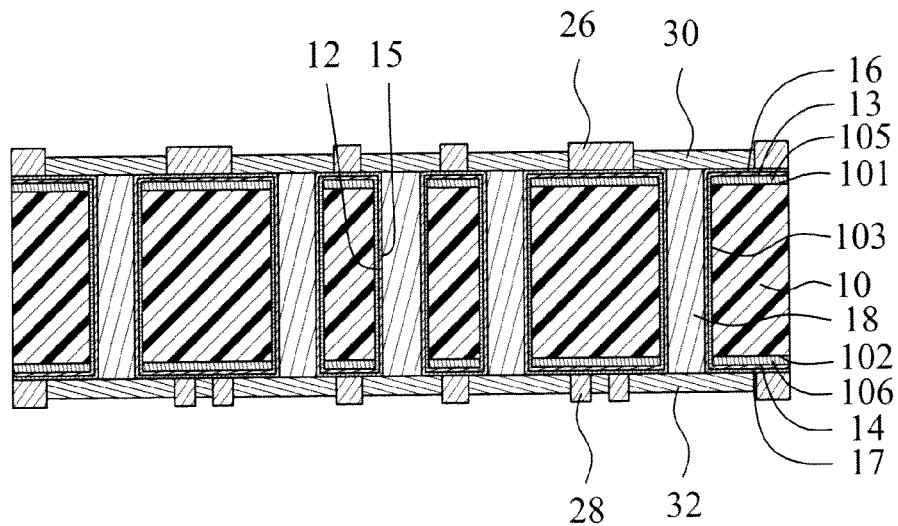

Referring to FIG. 9, a conductive material is disposed over the ends of the vias 18 as well as the first barrier layers 16 and the second barrier layer 17 to form the upper metal pattern 30 and the lower metal pattern 32, respectively. In this embodiment, the conductive material may have similar characteristics to the material of the first metal layer 105 and the second metal layer 106, such as Cu or an alloy of Cu. However, in other embodiments, the material of the upper metal pattern 30 and the lower metal pattern 32 may be different from that of the first metal layer 105 and the second metal layer 106. The upper metal pattern 30 and the lower metal pattern 32 may be formed using any coating technique, such as electrolytic plating.

Figure 10:
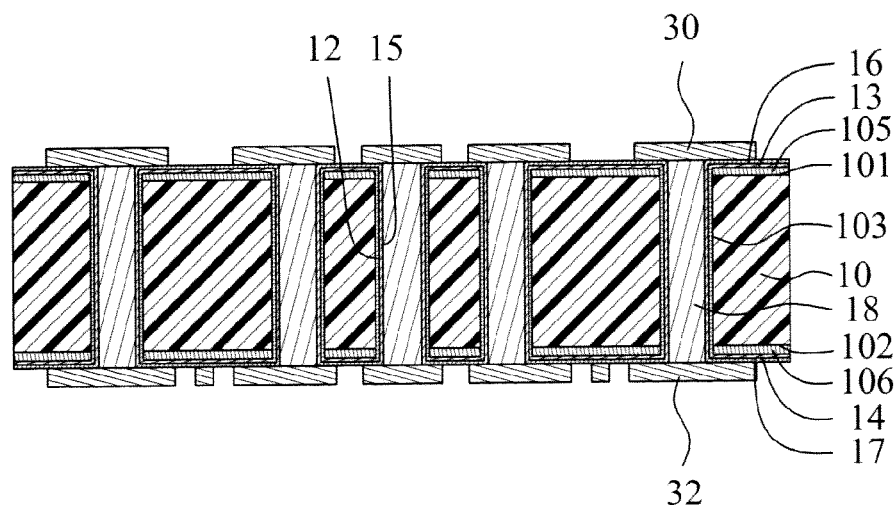
Figure 11:
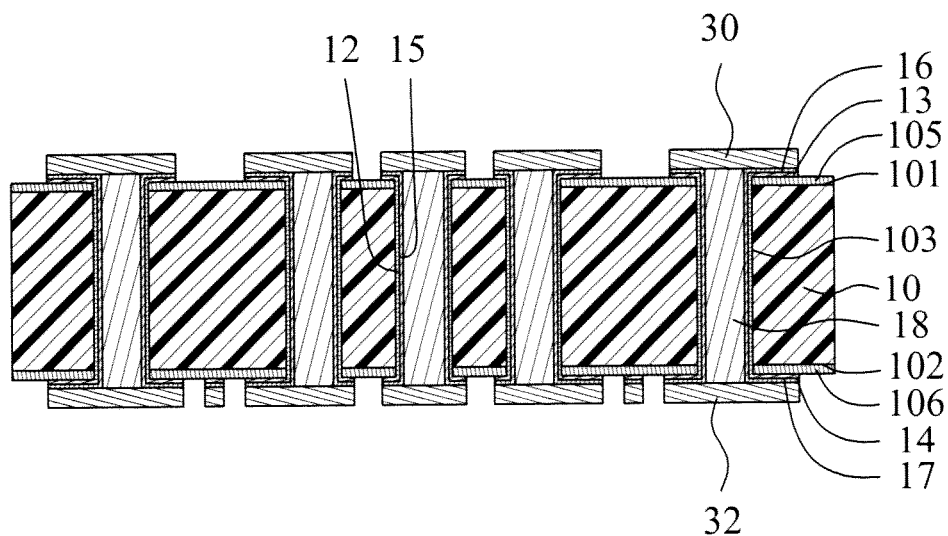

Referring to FIG. 10, the first photoresist pattern 26 and the second photoresist pattern 28 are stripped, such as, for example, by etching. Referring to FIG. 11, portions of the first barrier layer 16 and the first intermediate metal layer 13 that are exposed and not covered by the upper metal pattern 30 are removed to form the patterned first barrier layer 16 and patterned first intermediate metal layer 13. Likewise, portions of the second barrier layer 17 and the second intermediate metal layer 14 that are exposed and not covered by the lower metal pattern 32 are removed to form the patterned second barrier layer 17 and patterned second intermediate metal layer 14.

Figure 12:
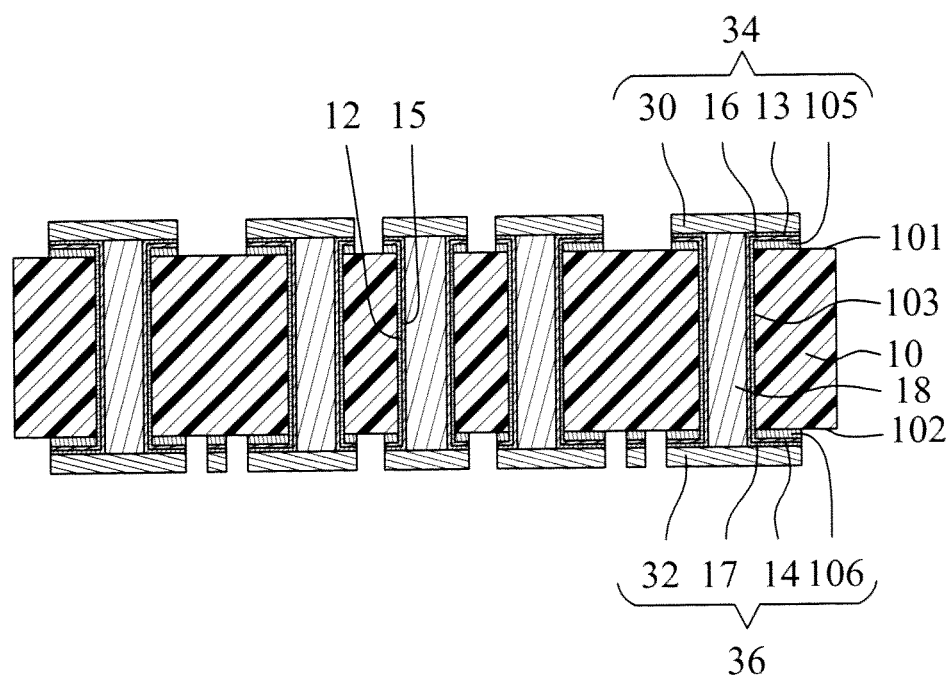

Referring to FIG. 12, the exposed portions of the first metal layer 105 are removed to form the first patterned metal layer 105. In this embodiment, the exposed portion of the first metal layer 105 is removed, for example by etching, by using the upper metal pattern 30 as a mask so that undesired portions of first metal layer 105 are removed. Thus, the plurality of first circuit segments 34 are fully completed and portions of the first surface 101 of the core 10 are exposed. Sidewalls of the first patterned metal layer 105, the first intermediate metal layer 13, the first barrier layer 16, and the upper metal pattern 30 are substantially coplanar. Portions of the first patterned metal layer 105, the first intermediate metal layer 13 and the first barrier layer 16 have an annular shape with substantially similar inner and outer diameters and circumscribe the conductive pillars 18. The first circuit segments 34 are electrically insulated from each other.

Likewise, the exposed portions of the second metal layer 106 are removed. Thus, the plurality of second circuit segments 36 are fully completed and portions of the second surface 102 of the core 10 are exposed. Sidewalls of the second patterned metal layer 106, the second intermediate metal layer 14, the second barrier layer 17, and the lower metal pattern 32 are substantially coplanar. Portions of the second patterned metal layer 106, the second intermediate metal layer 14, and the second barrier layer 17 have an annular shape with substantially similar inner and outer diameters and circumscribe the conductive pillars 18. Similar to the first circuit segments 34, the second circuit segments 36 may have traces or pads, and are electrically insulated from each other. In some embodiments, the portions of the barrier layers 16, 17, the intermediate metal layers 13, 14, and the metal layers 105, 106 that are not covered by corresponding metal patterns 30, 32 may be removed in one step. Subsequently, and prior to die attaché, the first protection layer 38 is formed on the first circuit segments 34, and the second protection layer 42 is formed on the second circuit segments 36. Then, the surface finish layer 40 is formed on some of the exposed portions of the first circuit segments 34.

Figure 13:
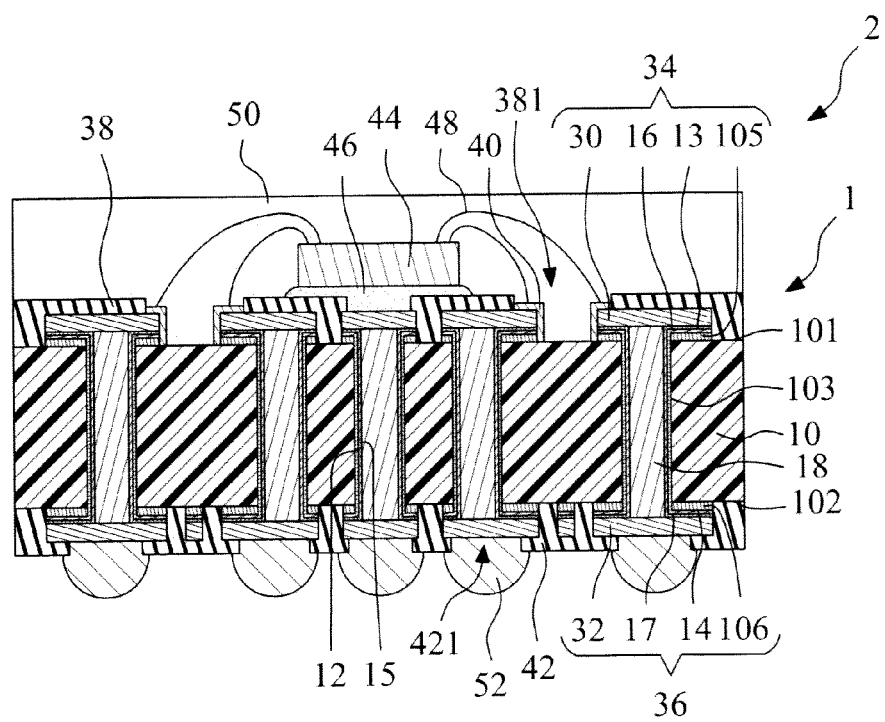
FIG. 13 illustrates a cross-sectional view of a semiconductor package according to one of the present embodiments.

Referring to FIG. 13, a semiconductor package 2 according to one of the present embodiments is illustrated. The semiconductor package 2 includes a die 44 disposed on the package substrate 1 of FIG. 1, a plurality of bonding wires 48, a molding compound 50, and a plurality of solder balls 52. The die 44 is attached to the first protection layer 38 of the package substrate 1 by an adhesive layer 46. The die 44 is electrically connected to the first circuit segments 34 by bonding wires 48. Alternatively, the die 44 may be electrically connected to the first circuit segments 34 via flip chip bonding.

The molding compound 50 is disposed on the first protection layer 38 of the package substrate 1 and substantially covers or encapsulates the die 44 and the bonding wires 48 to provide mechanical stability as well as protection against oxidation, humidity, and other environmental conditions. The molding compound 50 may be made of a Novolac-based resin, an epoxy-based resin, a silicone-based resin, or any other suitable encapsulant. The solder balls 52 are disposed in the openings 421 of the second protection layer 42, and contact the second circuit segments 36. The solder balls 52 may be used for making electrical connection to another semiconductor package or to an external circuit board.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not be necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor package, comprising:
   a substrate, the substrate comprising
      a core having a plurality of through holes and defining a first surface;
      a plurality of circuit segments disposed on the core, each of the circuit segments including a first patterned metal layer on the first surface, an intermediate metal layer on the first patterned metal layer, a barrier layer on the intermediate metal layer, and an upper metal pattern on the barrier layer; and
      a plurality of conductive pillars disposed in the through holes of the core and connected to the circuit segments, wherein an end of each conductive pillar protrudes from the first surface of the core such that an end surface of each conductive pillar is coplanar with a surface of a corresponding portion of the barrier layer, and wherein the upper metal pattern covers the end surfaces of the conductive pillars and the coplanar surface of the barrier layer.

2. The semiconductor package of claim 1, wherein lateral surfaces of the first patterned metal layer, the intermediate metal layer, the barrier layer, and the upper metal pattern are coplanar.

3. The semiconductor package of claim 1, wherein the conductive pillars are formed from a material that can be selectively removed without affecting the barrier layer.

4. The semiconductor package of claim 1, wherein the first patterned metal layer, the intermediate metal layer, and the barrier layer of each circuit segment each include a portion that is annular and that circumscribes one of the conductive pillars.

5. The semiconductor package of claim 1, further comprising a protection layer disposed on the circuit segments, wherein the protection layer has a plurality of openings to expose portions of the circuit segments.

6. The semiconductor package of claim 5, further comprising a surface finish layer disposed on the exposed portions of the circuit segments.

7. The semiconductor package of claim 1, wherein an opposite end of each conductive pillar protrudes from a second surface of the core such that an opposite end surface of each conductive pillar is coplanar with a surface of a corresponding portion of the barrier layer.

8. The semiconductor package of claim 7, wherein a lower metal pattern covers the opposite end surfaces of the conductive pillars and the coplanar surface of the barrier layer.

9. A semiconductor package, comprising:
   a substrate, the substrate comprising
      a core having a plurality of through holes and defining a first surface;
      a plurality of circuit segments disposed on the core, each of the circuit segments including a first patterned metal layer on the first surface, an intermediate metal layer on the first patterned metal layer, a barrier layer on the intermediate metal layer, and an upper metal pattern on the barrier layer, wherein lateral surfaces of the first patterned metal layer, the intermediate metal layer, the barrier layer, and the upper metal pattern are coplanar; and
      a plurality of conductive vias disposed in the through holes of the core and connected to the circuit segments;
      wherein an end of each conductive via protrudes from the first surface of the core such that an end surface of each conductive via is coplanar with a surface of a corresponding portion of the barrier layer, and wherein the upper metal pattern covers the end surfaces of the conductive vias and the coplanar surface of the barrier layer.

10. The semiconductor package of claim 9, further comprising a protection layer disposed on the circuit segments, wherein the protection layer has a plurality of openings to expose portions of the circuit segments.

11. The semiconductor package of claim 10, further comprising a surface finish layer disposed on the exposed portions of the circuit segments.

12. The semiconductor package of claim 9, wherein an opposite end of each conductive pillar protrudes from a second surface of the core such that an opposite end surface of each conductive pillar is coplanar with a surface of a corresponding portion of the barrier layer.

13. The semiconductor package of claim 12, wherein a lower metal pattern covers the opposite end surfaces of the conductive pillars and the coplanar surface of the barrier layer.

14. A method for making a semiconductor package substrate, the method comprising:
   disposing a first metal layer on a core;
   forming a plurality of through holes penetrating the core and the first metal layer;
   forming an intermediate metal layer in the through holes and on the first metal layer;
   forming a barrier layer on the intermediate metal layer;
   applying a conductive material on the barrier layer to form a surface plating portion and in the through holes to form a plurality of conductive pillars;
   removing the surface plating portion until the barrier layer is exposed;
   forming an upper metal pattern on the exposed barrier layer and the conductive pillars; and
   removing portions of the barrier layer, the intermediate metal layer and the first metal layer that are not covered by the upper metal pattern so as to form a plurality of circuit segments;
   wherein an end of each conductive pillar protrudes from a first surface of the core such that an end surface of each conductive pillar is coplanar with a surface of a corresponding portion of the barrier layer, and wherein the upper metal pattern covers the end surfaces of the conductive pillars and the coplanar surface of the barrier layer.

15. The method of claim 14, wherein the upper metal pattern is formed by:
- forming a photoresist pattern on the barrier layer, wherein the photoresist pattern has a plurality of openings;
- applying a conductive material in the openings of the photoresist pattern to form the upper metal pattern; and
- stripping the photoresist pattern.

16. The method of claim 14, further comprising forming a protection layer on the circuit segments, wherein the protection layer has a plurality of openings to expose portions of the circuit segments.

17. The method of claim 16, further comprising forming a surface finish layer on the exposed portions of the circuit segments.

18. The method of claim 14, wherein the conductive pillars are formed from a material that can be selectively removed without affecting the barrier layer.

19. The method of claim 14, wherein the barrier layer is nickel.

* * * * *